(12) United States Patent
Sherman

(10) Patent No.: US 8,159,372 B2
(45) Date of Patent: Apr. 17, 2012

(54) KEYBOARD WITH PLURAL KEY SWITCH MATRICES TO DETECT GHOSTING

(75) Inventor: Nathan C Sherman, Bellevue, WA (US)

(73) Assignee: Microsoft Corporation, Redmond, WA (US)

( * ) Notice: Subject to any disclaimer, the term of this patent is extended or adjusted under 35 U.S.C. 154(b) by 1218 days.

(21) Appl. No.: 11/872,729

(22) Filed: Oct. 16, 2007

(65) Prior Publication Data

US 2009/0096640 A1    Apr. 16, 2009

(51) Int. Cl.
*H03M 11/00*    (2006.01)

(52) U.S. Cl. ............ 341/24; 341/20; 341/26; 400/472; 345/67; 345/73

(58) Field of Classification Search ............ 341/20–35; 200/520, 600; 345/168, 173; 307/116; 400/472–496; 340/2.27, 14.1–14.69; 710/67, 710/73
See application file for complete search history.

(56) References Cited

U.S. PATENT DOCUMENTS

| | | | |
|---|---|---|---|
| 4,599,608 A * | 7/1986 | Matsuoka | 341/26 |
| 4,888,600 A | 12/1989 | Anderson et al. | |
| 5,220,323 A | 6/1993 | Ito et al. | |
| 5,555,004 A | 9/1996 | Ono et al. | |
| 6,630,927 B2 | 10/2003 | Sherman et al. | |
| 6,831,630 B2 | 12/2004 | Mamata | |
| 6,961,008 B2 * | 11/2005 | Feng | 341/26 |
| 7,126,498 B2 * | 10/2006 | Levy | 341/22 |
| 2006/0053391 A1 | 3/2006 | de Brebisson | |

FOREIGN PATENT DOCUMENTS

| | | | | |
|---|---|---|---|---|
| GB | 2221071 A | | 1/1990 | |
| GB | 2263990 A | | 11/1993 | |
| JP | 11102250 A | * | 4/1999 | 714/813 |

OTHER PUBLICATIONS

Dribin, "Keyboard Matrix Help", pp. 11, V 1.124, Jun. 2000.
"AVR243: Matrix Keyboard Decoder", 2003, ATMEL Corporation, pp. 11.
Brouwer, ,"The Linux keyboard and console HOWTO" v2.13, Oct. 12, 2002, pp. 33.

* cited by examiner

*Primary Examiner* — George Bugg
*Assistant Examiner* — Franklin Balseca
(74) *Attorney, Agent, or Firm* — Alleman Hall McCoy Russell & Tuttle LLP

(57) ABSTRACT

Keyboard apparatus and methods for processing keyboard depressions are disclosed. One disclosed keyboard apparatus includes a keyboard having a plurality of keys configured to be depressed in a concurrent depression state, and a plurality of key switch matrices. Each key switch of the plurality of key switch matrices may be configured to be actuated by a corresponding key of the keyboard. The keyboard apparatus may further include a keyboard controller configured to determine whether a sensed key depression in the concurrent depression state is a ghost key depression, based on sensed key switch states of respective key switches in each of the plurality of key switch matrices which correspond to the sensed key depression.

20 Claims, 6 Drawing Sheets

| A1 | B1 | C1 | D1 | E1 | F1 | G1 | H1 | I1 | J1 | K1 | L1 | M1 |
|---|---|---|---|---|---|---|---|---|---|---|---|---|
| A2 | B2 | C2 | D2 | E2 | F2 | G2 | H2 | I2 | J2 | K2 | L2 | M2 |
| A3 | B3 | C3 | D3 | E3 | F3 | G3 | H3 | I3 | J3 | K3 | L3 | M3 |
| A4 | B4 | C4 | D4 | E4 | F4 | G4 | H4 | I4 | J4 | K4 | L4 | M4 |
| A5 | B5 | C5 | D5 | E5 | F5 | G5 | H5 | I5 | J5 | K5 | L5 | M5 |
| A6 | B6 | C6 | D6 | E6 | F6 | G6 | H6 | I6 | J6 | K6 | L6 | M6 |
| A7 | B7 | C7 | D7 | E7 | F7 | G7 | H7 | I7 | J7 | K7 | L7 | M7 |
| A8 | B8 | C8 | D8 | E8 | F8 | G8 | H8 | I8 | J8 | K8 | L8 | M8 |
| A9 | B9 | C9 | D9 | E9 | F9 | G9 | H9 | I9 | J9 | K9 | L9 | M9 |
| A10 | B10 | C10 | D10 | E10 | F10 | G10 | H10 | I10 | J10 | K10 | L10 | M10 |
| A11 | B11 | C11 | D11 | E11 | F11 | G11 | H11 | I11 | J11 | K11 | L11 | M11 |
| A12 | B12 | C12 | D12 | E12 | F12 | G12 | H12 | I12 | J12 | K12 | L12 | M12 |
| A13 | B13 | C13 | D13 | E13 | F13 | G13 | H13 | I13 | J13 | K13 | L13 | M13 |

FIG. 4

| A1 | B13 | C12 | D11 | E10 | F9 | G8 | H7 | I6 | J5 | K4 | L3 | M2 |
|----|-----|-----|-----|-----|----|----|----|----|----|----|----|----|
| B2 | C1 | D13 | E12 | F11 | G10 | H9 | I8 | J7 | K6 | L5 | M4 | A3 |
| C3 | D2 | E1 | F13 | G12 | H11 | I10 | J9 | K8 | L7 | M6 | A5 | B4 |
| D4 | E3 | F2 | G1 | H13 | I12 | J11 | K10 | L9 | M8 | A7 | B6 | C5 |
| E5 | F4 | G3 | H2 | I1 | J13 | K12 | L11 | M10 | A9 | B8 | C7 | D6 |
| F6 | G5 | H4 | I3 | J2 | K1 | L13 | M12 | A11 | B10 | C9 | D8 | E7 |
| G7 | H6 | I5 | J4 | K3 | L2 | M1 | A13 | B12 | C11 | D10 | E9 | F8 |
| H8 | I7 | J6 | K5 | L4 | M3 | A2 | B1 | C13 | D12 | E11 | F10 | G9 |
| I9 | J8 | K7 | L6 | M5 | A4 | B3 | C2 | D1 | E13 | F12 | G11 | H10 |
| J10 | K9 | L8 | M7 | A6 | B5 | C4 | D3 | E2 | F1 | G13 | H12 | I11 |
| K11 | L10 | M9 | A8 | B7 | C6 | D5 | E4 | F3 | G2 | H1 | I13 | J12 |
| L12 | M11 | A10 | B9 | C8 | D7 | E6 | F5 | G4 | H3 | I2 | J1 | K13 |
| M13 | A12 | B11 | C10 | D9 | E8 | F7 | G6 | H5 | I4 | J3 | K2 | L1 |

FIG. 5A

ROW DIAGONAL ORIENTATION

COLUMN DIAGONAL ORIENTATION

| A1 | B13 | C12 | D11 | E10 | F9 | G8 | H7 | I6 | J5 | K4 | L3 | M2 |
|----|-----|-----|-----|-----|----|----|----|----|----|----|----|----|
| B2 | C1 | D13 | E12 | F11 | G10 | H9 | I8 | J7 | K6 | L5 | M4 | A3 |
| C3 | D2 | E1 | F13 | G12 | H11 | I10 | J9 | K8 | L7 | M6 | A5 | B4 |
| D4 | E3 | F2 | G1 | H13 | I12 | J11 | K10 | L9 | M8 | A7 | B6 | C5 |
| E5 | F4 | G3 | H2 | I1 | J13 | K12 | L11 | M10 | A9 | B8 | C7 | D6 |
| F6 | G5 | H4 | I3 | J2 | K1 | L13 | M12 | A11 | B10 | C9 | D8 | E7 |
| G7 | H6 | I5 | J4 | K3 | L2 | M1 | A13 | B12 | C11 | D10 | E9 | F8 |
| H8 | I7 | J6 | K5 | L4 | M3 | A2 | B1 | C13 | D12 | E11 | F10 | G9 |
| I9 | J8 | K7 | L6 | M5 | A4 | B3 | C2 | D1 | E13 | F12 | G11 | H10 |
| J10 | K9 | L8 | M7 | A6 | B5 | C4 | D3 | E2 | F1 | G13 | H12 | I11 |
| K11 | L10 | M9 | A8 | B7 | C6 | D5 | E4 | F3 | G2 | H1 | I13 | J12 |
| L12 | M11 | A10 | B9 | C8 | D7 | E6 | F5 | G4 | H3 | I2 | J1 | K13 |
| M13 | A12 | B11 | C10 | D9 | E8 | F7 | G6 | H5 | I4 | J3 | K2 | L1 |

FIG. 5B

KEYBOARD WITH PLURAL KEY SWITCH MATRICES TO DETECT GHOSTING

BACKGROUND

Current designs of keyboards commonly detect individual key depressions using a matrix of electrical connections organized into rows and columns, where each row and column is connected to a pin of a keyboard controller that is electrically read and/or driven by the keyboard controller. Each key switch is placed at an intersection of a row and a column, and actuation of a key switch by a corresponding key of the keyboard creates an electrical connection between that row and column. Individual key depressions are detected when signals created by the electrical connection between the rows and columns are scanned.

A "ghost" key depression may occur with this type of keyboard design when multiple keys are concurrently depressed, due to, for example, a low signal on a scanned column traveling to one or more other columns through keys depressed in those columns. In turn, the signal is transmitted through keys in those columns into a row in which no key is depressed in the scanned column, causing a row where no key is depressed on the scanned column to be at a low voltage and thus appear to have a key depressed.

Current keyboard designs may detect a potential ghost key depression through anti-ghosting algorithms. However, the signal output of the algorithms does not indicate which one(s) of the concurrently depressed keys is/are ghost key(s), if any. Therefore, current algorithms suppress reporting the current state of key depression until the potential ghost condition disappears. This may cause significant problem in computer gaming, for example where a player may be annoyed by missing keystrokes caused by suppression of key depression reporting by an anti-ghosting algorithm when multiple keys are depressed to perform multiple concurrent actions, resulting in decreased player satisfaction in gaming.

SUMMARY

A keyboard apparatus and a method for processing a keyboard depression are provided. In one example, the keyboard apparatus may include a keyboard which includes a plurality of keys configured to be depressed in a concurrent depression state. The keyboard apparatus may additionally include a plurality of key switch matrices. Each key switch of the plurality of key switch matrices is configured to be actuated by a corresponding key of the keyboard. The keyboard apparatus may further include a keyboard controller configured to determine whether a sensed key depression in the concurrent depression state is a ghost key depression, based on sensed key switch states of respective key switches in each of the plurality of key switch matrices which correspond to the sensed key depression.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

FIG. 4 illustrates an example 13×13 key switch matrix.

FIGS. 5A and 5B each illustrate an example 13×13 key switch matrix orthogonal to the key switch matrix of FIG. 4.

DETAILED DESCRIPTION

Figure 1:
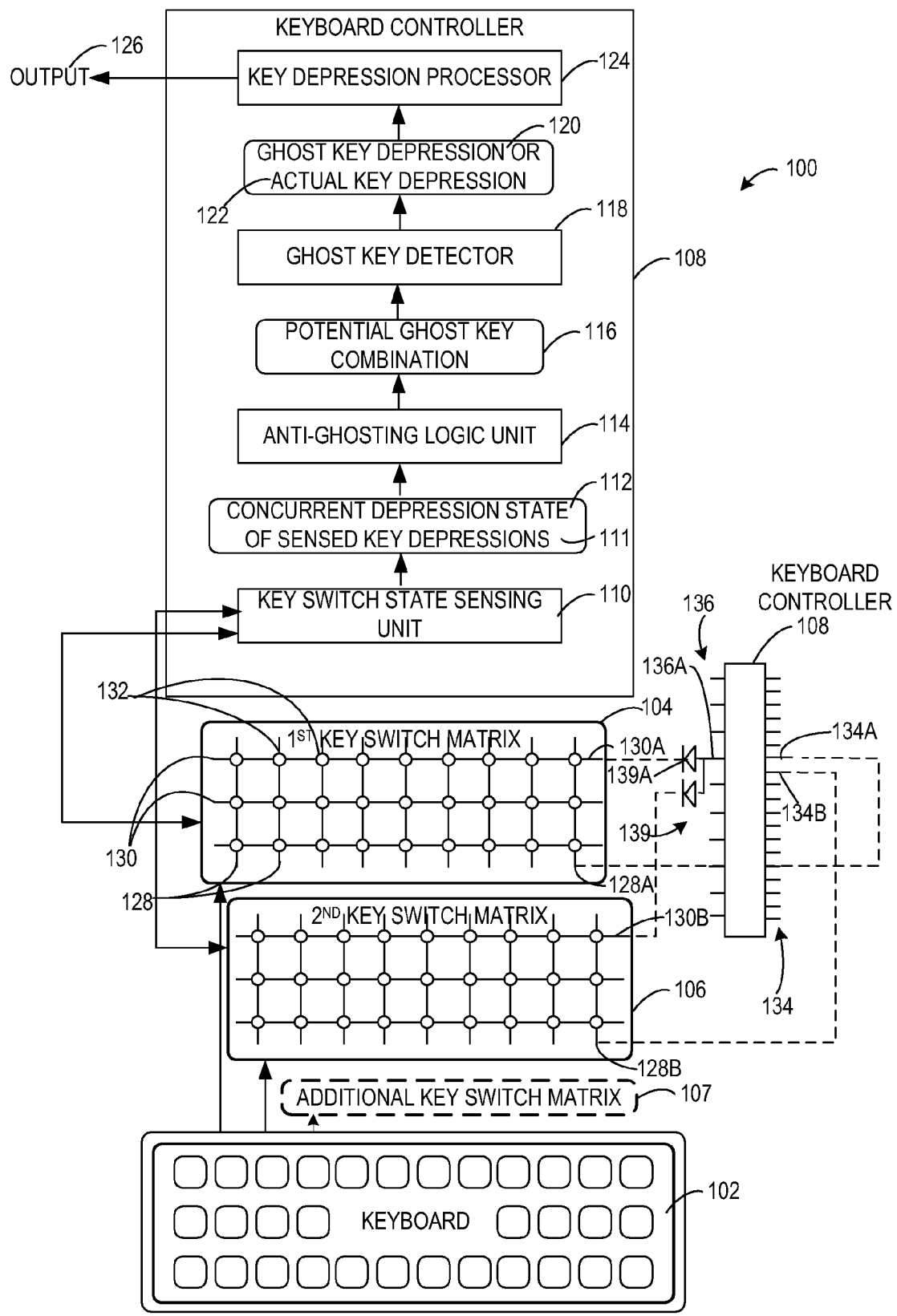
FIG. 1 illustrates a keyboard apparatus of a computing device having a plurality of key switch matrices that are configured to detect ghosting.

FIG. 1 illustrates a keyboard apparatus 100 of a computing device for processing key depression. The keyboard apparatus 100 may include a keyboard 102, including a plurality of keys that are configured to be depressed in a concurrent depression state. That is, multiple (more than one) keys of the keyboard may be depressed concurrently, or close in time of depression, so that the keyboard controller 108 may perceive an overlap in key depression signals.

The keyboard apparatus 100 may additionally include a plurality of key switch matrices that include a plurality of key switches arranged in respective matrices. Each key switch of the plurality of key switch matrices may be configured to be actuated by a corresponding key of the keyboard 102. In one example, the plurality of key switch matrices may include a first key switch matrix 104 and a second key switch matrix 106.

The keyboard apparatus 100 may further include a keyboard controller 108 configured to determine whether a sensed key depression in the concurrent depression state is a ghost key depression, based on sensed key switch states of respective key switches in each of the plurality of key switch matrices which correspond to the sensed key depression. As used herein the term "ghost" key depression refers to a sensed key depression that does not result from an actual key depression of the key corresponding to the sensed key depression. A ghost condition occurs when circuit paths exist through depressed switches in the matrix that electrically connect the sensed column to a row in the sensed column that does not have a switch depressed in the sensed column, resulting in an incorrect indication that a key is depressed.

The keyboard controller 108 may include a key switch state sensing unit 110 configured to utilize a first key switch matrix 104 of the plurality of key switch matrices to sense a key switch state of the plurality of keys of the keyboard 102, including a concurrent depression state 112 of the plurality of keys of the keyboard 102 and a sensed key depression 111 for individual keys of the plurality of keys of the keyboard 102.

For example, the key switch state sensing unit 110 may be configured to begin scanning a key switch state of a key switch matrix of the plurality of key switch matrices by assuring that all rows (e.g., corresponding to sense lines) and columns (e.g., corresponding to drive lines) of the key switch matrix are in a high-Z (not driven high or low, or "floating") state at a plurality of controller pins of the keyboard controller 108. Typically, both rows and columns are tied to pull-up resistors and the pins are not actively driven high or low except for the one column that is being read, which is driven low. This ensures an accurate "high" read on rows that are not connected to the sensed column. These resistors may be internal to the processor, or external. One by one, each column pin or drive line pin of the plurality of controller pins of the keyboard controller 108 is pulled low, the row pins or sense line pins of the plurality of controller pins are read into the keyboard controller 108, and the column pins or drive line pins are released. This creates a bitmap of the key switch state of the key switch matrix in a memory of the keyboard controller 108, where a "1" for a key switch may represent that a corresponding key of the keyboard 102 is not depressed and where a "0" for a key switch may represent that the key corresponding to the key switch is depressed. Other embodiments may reverse the sense so that a "1" represents a depressed key and "0" represents a key that is not depressed. After the bitmap is read, the key switch sensing unit 110 may process the bitmap to determine which keys of the keyboard 102 with a sensed key depression in the first key switch matrix 104 are depressed and which are not. Ancillary electrical or firmware algorithms may be used to perform debouncing to remove digital noise inherent in any key switches of the key switch matrix.

The keyboard controller 108 may include an anti-ghosting logic unit 114 configured to determine whether a potential ghost key combination 116 exits for the concurrent depression state 112 sensed by the key switch sensing unit 110 for the plurality of keys of the keyboard 102. For example, the anti-ghosting logic unit 114 may determine that a potential ghost key combination 116 exists for a concurrent depression state 112, if the concurrent depression state 112 includes sensed key depressions of two keys for which corresponding key switches share a column in the key switch matrix and also includes a sensed key depression of a third key for which a corresponding key switch shares a row in the key switch matrix with one of the first two keys that share a column. In some embodiments, the ghost key detector 118 may be configured to scan only the drive lines and sense lines of the second key switch matrix of the key switch(es) corresponding to the sensed key depressions. It will be appreciated that the ghost key detector 118 may scan a second key switch matrix 104 and additional key switch matrices 107 to determine whether a sensed key depression is an actual key depression or a ghost key depression, as discussed in detail below.

The keyboard controller 108 may further include a ghost key detector 118 configured to utilize a second key switch matrix 106 to determine whether any of the keys that is sensed by the first key switch matrix 104 to be in the concurrent depression state 112 is a ghost key depression 120 or an actual key depression 122.

The ghost key detector 118 may be configured to scan the second key switch matrix 106 for a key switch state of the second key switch matrix 106 to determine whether the sensed key depression is an actual key depression or a ghost key depression. In one specific example, the ghost key detector 118 may be configured to scan key switch state in the first key switch matrix 104 and the second key switch matrix 106. Keys that are sensed to be depressed in both the first key switch matrix 104 and the second key switch matrix 106 may be determined as actual key depression and would be processed. On the other hand, keys that are only sensed to be depressed in only the first key switch matrix 104 may be determined as a ghost key depression and would be ignored.

The ghost key detector 118 may be configured to scan the drive lines and sense lines of the second key switch matrix for the key switch corresponding to the sensed key depression. In one specific example, the ghost key detector 118 may be configured to first scan the first key switch matrix 104. If a concurrent depression state is sensed in the first key switch matrix 104, for each sensed key depression, the ghost key detector 118 would scan the second key switch matrix 106 for a key switch state of the second key switch matrix 106 for the key switch that corresponds to the sensed key depression sensed in the first key switch matrix 104. If the state of the key switch of the second key switch matrix 106 that corresponds to the sensed key depression sensed in the first key switch matrix 104 is not in a depressed state, in other words if the key is not also sensed as depressed in the second key switch matrix 106, the key depression sensed by the first key switch matrix would be determined as a ghost key depression and would be ignored. On the other hand, if the state of the key switch of the second key switch matrix 106 that corresponds to the sensed key depression in the first key switch matrix 104 is sensed to be in a depressed state by the second key switch matrix 106, in other words if the key is also sensed depressed in the second key switch matrix 106, the key depression sensed by the first key switch matrix 104 would be determined as an actual key depression and would be processed accordingly.

It will be appreciated that the ghost key detector 118 may scan additional key switch matrices 107 to determine whether the sensed key depression is an actual key depression or a ghost key depression, if desired. For example, if three key switch matrices are provided per keyboard, the ghost key detector 118 may scan all three key switch matrices to determine whether a key depression is an actual key depression or a ghost key depression. If a key is actually pressed, it will show as pressed in all of the matrices. If it is not actually pressed, it will show as not pressed in at least one of the matrices. Additional matrices 107 may be added to enable the system to detect ghosting for higher numbers of combinations of keys. In some embodiments, after scanning the first key switch matrix, a the keyboard controller may be configured to use anti-ghosting algorithms to narrow the possibilities of sensed key depressions that might be ghost key depressions, and only the only the narrowed set of potential ghost depressions determined by the anti-ghosting algorithms may be scanned in the second matrix 104 and additional matrices 107.

The keyboard controller 108 may further include a key depression processor 124 configured to suppress reporting of an output 126 that indicates that the sensed key depression 111, in a concurrent depression state 112, is an actual key depression 122, if the key depression processor 124 determines that the sensed key depression 111 is a ghost key depression 120. On the other hand, the key depression processor 124 may be configured to report the output 126 that indicates the sensed key depression 111, in a concurrent depression state 112, is an actual key depression 122, if the key depression processor 124 determines that the sensed key depression 111 is the actual depression 122. In some examples, if the second key switch matrix 106 or any additional key switch matrices 107 of the plurality of key switch matrices indicates that the sensed key depression is a ghost key depression, the key depression processor 124 may suppress reporting the output 126.

The plurality of key switch matrices, such as the first key switch matrix 104 and the second key switch matrix 106, may be sufficiently orthogonal to (i.e., independent of) each other to enable the keyboard controller 108 to eliminate ghosting or reduce ghosting to an acceptable level for a given number of key depression combinations, such as for all 3-key depression combinations, for all 4-key depression combinations, and/or for all 5-key depression combinations of the keyboard 102.

Each of the plurality of key switch matrices of the keyboard apparatus 100 may include a circuit grid. The circuit grid may include a plurality of drive lines 128 intersecting a plurality of sense lines 130. The circuit grid may further include a plurality of key switches 132 disposed at intersections of the plurality of drive lines 128 and the plurality of sense lines 130. Each of the plurality of key switches 132 may be configured to be actuated by a corresponding key of the keyboard 102. When the corresponding key of the keyboard 102 is depressed, a key switch state of each of the plurality of key switch matrices may be sensed by sequentially selecting and inputting a signal to an arbitrary one of the plurality of the drive lines 128, and by reading the plurality of sense lines 130.

The keyboard controller 108 may include a plurality of controller pins including a plurality of drive line pins 134 and a plurality of sense line pins 136. Each of the plurality of drive line pins 134 is coupled to a corresponding drive line of the plurality of drive lines 128 in each of the plurality of key switch matrices. Each of the plurality of sense line pins 136 is coupled to a corresponding sense line in the plurality of sense lines 130 in each of the plurality of key switch matrices.

The plurality of key switch matrices may share pins on the keyboard controller 108. For example, each of the plurality of drive line pins 134 may be shared among counterpart sense lines in the plurality of key switch matrices. For example and as illustrated in FIG. 1, sense line pin 136A is shared between sense line 130A of the first key switch matrix 104 and sense line 130B of the second key switch matrix 106. In contrast, each of the plurality of drive line pins 134 may not be shared among counterpart drive lines in the plurality of key switch matrix. For example in FIG. 1, the drive line 128A of the first key switch matrix 104 is coupled to a drive line pin 134A, while the drive line 128B of the second key switch matrix 106 is coupled to a separate drive line pin 134B.

Sharing the plurality of sense line pins 136 may reduce number of pins to be used in keyboard controller 108. In one embodiment, a 13×13 first key switch matrix may be utilized, with 26 drive line pins, 13 sense line pins, and 26 diodes, in a 169 key matrix. In another embodiment, eight additional pins may be provided and assigned to modifier keys (e.g., SHIFT, CTRL, etc.), for a total of 47 pins, and 26 diodes. This may provide ghost detection for any four key combination, plus any combination of modifier keys.

Figure 6A:
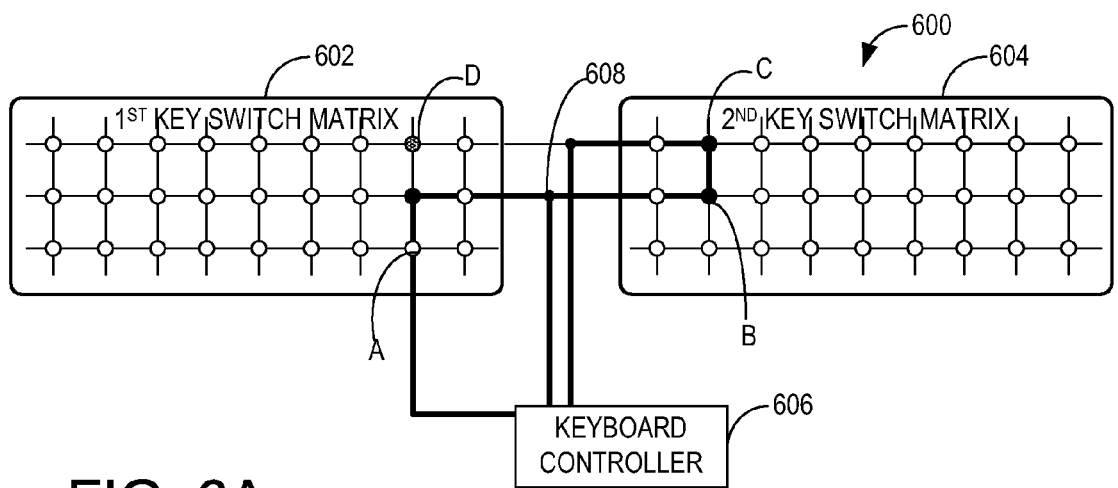
FIGS. 6A, 6B, and 6C each illustrates flow of a low signal, which corresponds to a key depression, in key switch matrices of different embodiments.

As illustrated in FIG. 6A, sharing pins may in some instances cause ghost key depressions. For this reason, in some examples, two key switch matrices that share the plurality of drive line pins and/or the plurality of sense line pins may be electronically isolated by diodes, such as by two layers of diodes. The diodes may be blocking diodes, and each of the diodes may be configured to have its anode facing the keyboard controller 108. In this way, current cannot pass from a first key switch matrix to a second key switch matrix and then back to the first key switch matrix, which may affect scanning of a key switch matrix for a key switch state of the key switch matrix.

For example, each sense line 130 may be connected to a sense line pin 136 via a sense line diode 139. Thus, each sense line of the first key switch matrix 104 is separated from each sense line of the second key switch matrix 106 by two sense line diodes 139. As illustrated further in FIG. 6B, using diodes to isolate the key switch matrices may prevent a low signal indicating key depression at a first key switch from traversing from the first key switch matrix to a second key switch matrix through a sense line, and then back to the first key switch matrix to cause a ghost key depression in the first key switch matrix.

Figure 6B:
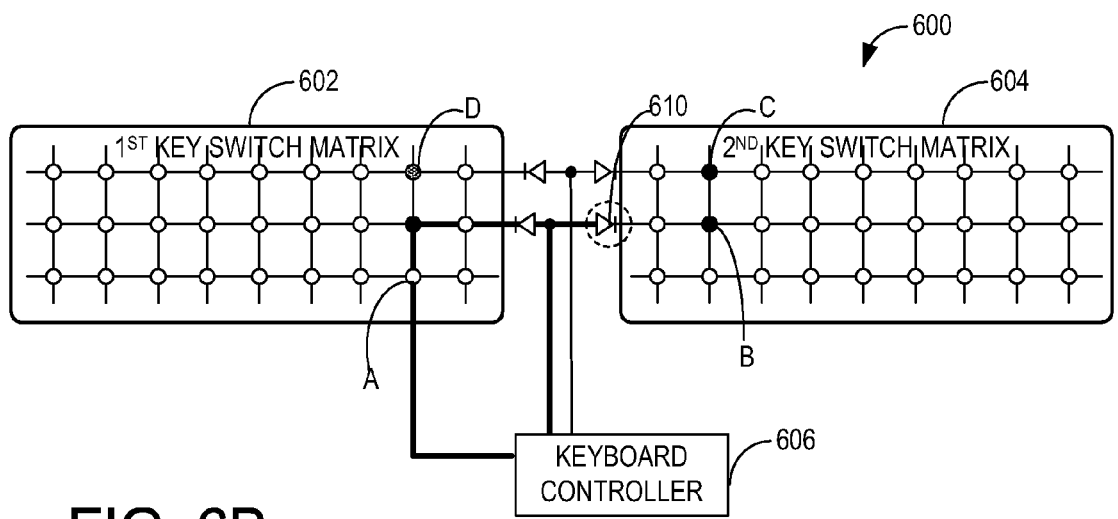
Figure 6C:
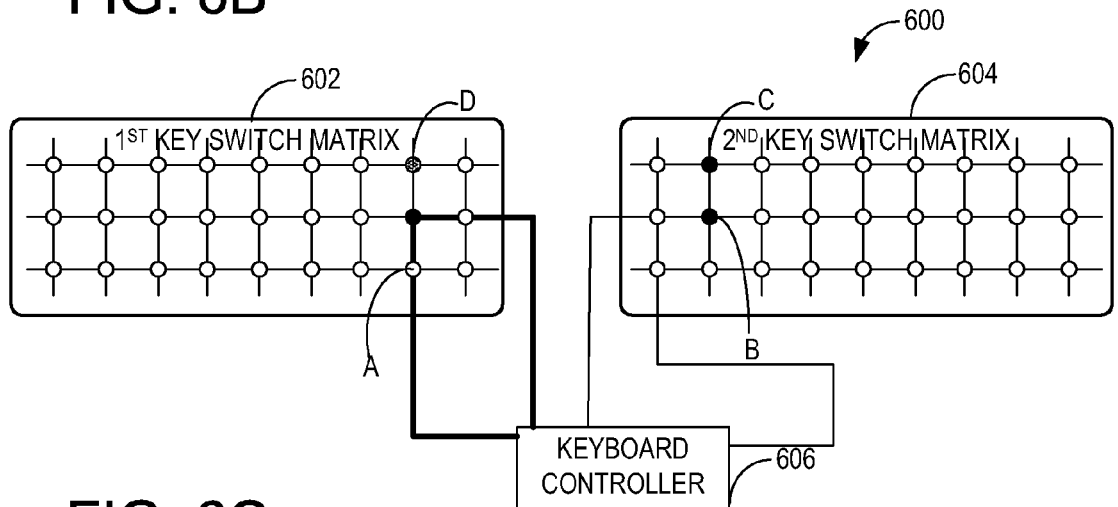

As illustrated in FIG. 6C, the plurality of key switch matrices may not share pins. Each sense line and drive line of a key switch matrix may have a dedicated pin that is not shared with another sense line or drive line. This may inhibit any ghost key depression that may be potentially caused by sharing pins.

In the example illustrated in FIG. 1, since only one drive line of a key switch matrix may be pulled down to input a drive signal to the drive line during a scanning of the key switch matrix for a key switch state of the key switch matrix, scanning of the key switch matrix for a key switch state may be alternatively performed by an external logic with the keyboard controller 108 merely selecting number of drive lines of the plurality of drive lines 128 to drive. It should be noted that although in this example the sense lines are row lines and drive lines are column lines, in other examples, the opposite may be true, that is the sense lines may be column lines and the drive lines may be row lines.

In one example, to scan the key switch matrix and determine which key switches are connected, the keyboard controller 108 may include an associated external decoder configured to receive a succession of binary drive line numbers from the keyboard controller 108 as input, and in response, to successively drive the corresponding drives line low. During this process, the sense lines may be monitored to determine which key switches have been connected. Those skilled in the art will recognize that the decoder may be a 5-bit to 26-bit decoder, or another suitably sized decoder. In addition, the keyboard controller 108 may also include latching shift registers on the sense lines. The output of multiple sense lines may be latched into shift registers, and the output of the shift registers may be serially sent to the controller via one sense line input pin. Such an implementation may reduce controller pins for the sense lines.

The keyboard controller 108 may be configured to select which key switch matrix will operate as the first key switch matrix. For example, if a large amount of ghost key depression has been detected in one key switch matrix, the keyboard controller 108 may use another key switch matrix as the first key switch matrix.

Figure 2:
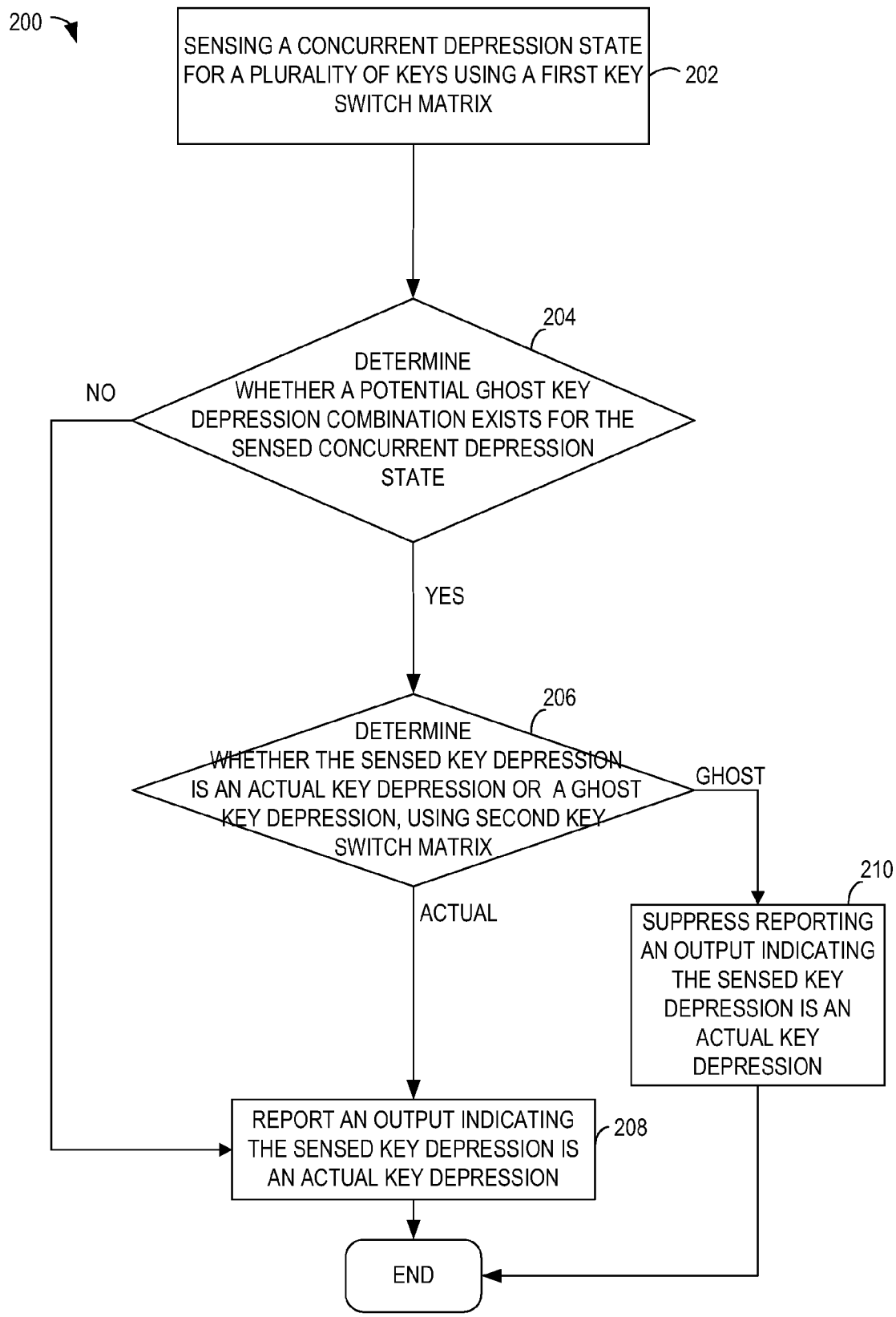
FIG. 2 is a flowchart of an embodiment of a method for processing key depression of the keyboard apparatus of FIG. 1, to detect ghosting.

FIG. 2 is a flowchart of a method 200 for processing key depressions of a keyboard. The method 200 may be executed by the keyboard controller 108 of the keyboard apparatus 100, or other suitable devices. The method 200 may typically include at step 202, sensing a concurrent depression state for a plurality of keys using a first key switch matrix.

At step 204, the method may include determining whether a potential ghost key depression combination exists for the sensed concurrent depression state. If a potential ghost key depression combination exists for the sensed concurrent depression state, the method proceeds to step 206, otherwise the method proceeds to step 208.

At 206, the method may include determining whether the sensed key depression is determined to be an actual key depression or a ghost key depression. This determination may be made by examining the state of a key switch corresponding to the sensed depression in a second key switch matrix that is sufficiently orthogonal to the first key switch matrix to inhibit or eliminate ghosting, for example, for 3, 4 and/or 5 key depression combinations of the keyboard, as discussed above. If the sensed key depression is determined to be a ghost key depression, the method proceeds to step 210. If the sensed key depression is an actual key depression, the method proceeds to step 208.

At 208, the method may include reporting an output indicating that the sensed key depression is an actual key depression. At 210, the method may include suppressing reporting of an output indicating that the sensed key depression is an actual key depression.

The following list sets forth a set of guidelines that may be used to design the first and second orthogonal key switch matrices referenced above. The set of guidelines may include:

Any two key switches sharing a row in a first key switch matrix may not share a row in a second key switch matrix Any two key switches sharing a column in a first key switch matrix may not share a row in a second key switch matrix Any two key switches sharing a row in a first key switch matrix may not share a column in a second key switch matrix Any two key switches sharing a column in a first key switch matrix may not share a column in a second key switch matrix The set of guidelines may specify that a number of rows of a key switch matrix be equal to the number of columns of the key switch matrix to avoid repeat patterns in row to column mapping, in which a single key switch is mapped to multiple locations within the key switch matrix. Utilizing a square matrix may have the added benefit of requiring fewer numbers of pins than any rectangular matrix may support.

Figure 3:
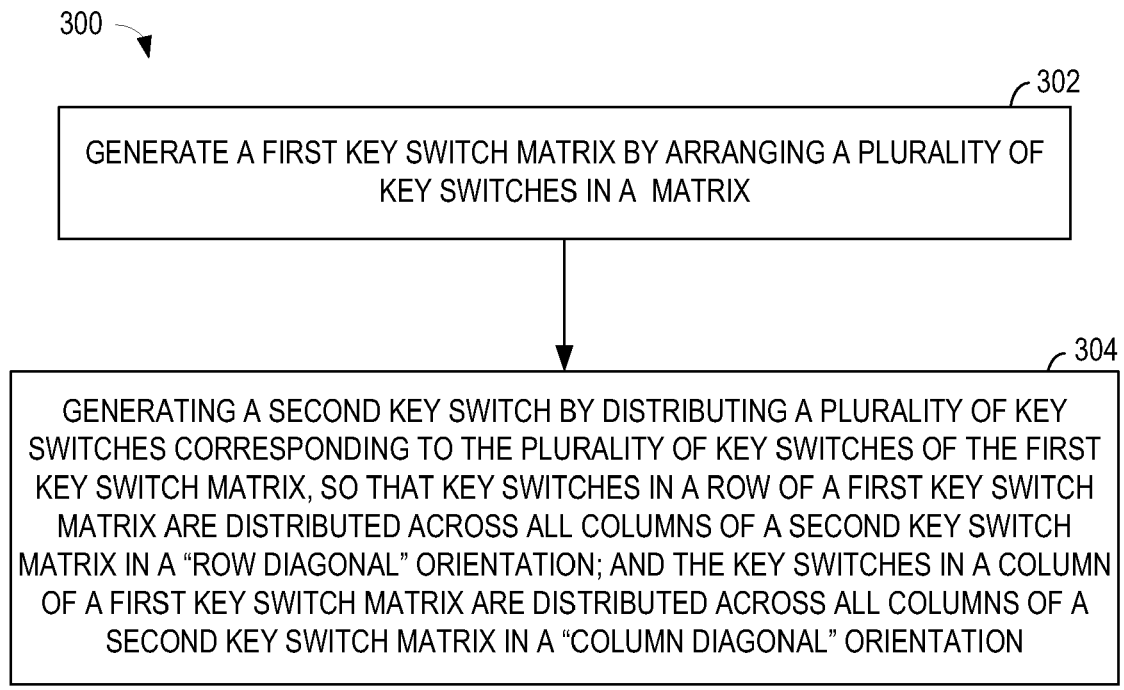
FIG. 3 is a flowchart of an embodiment of a method for generating orthogonal key switch matrices.

FIG. 3 illustrates an example method 300 of generating two orthogonal key switch matrices according to the set of guidelines listed above. The method 300 may include at step 302, generating a first key switch matrix by arranging a plurality of key switches of the first key switch matrix in a matrix. At step 304, the method may include generating a second key switch by distributing a plurality of key switches corresponding to the plurality of key switches of the first key switch matrix, so that key switches in a row of a first key switch matrix are distributed across all columns of a second key switch matrix in a "row diagonal" orientation, with the row of key switches of the first key switch matrix staggered across all columns of the second key switch matrix according to a staggering integer or increment; and the key switches in a column of a first key switch matrix are distributed across all columns of a second key switch matrix in a "column diagonal" orientation, with the column of key switches of the first key switch matrix staggered across all columns of the second key switch matrix according to a staggering integer or increment. The "row diagonal" orientation and the "column diagonal" orientation are arranged in such a way they are substantially perpendicular to each other. That is, the "row diagonal" orientation and the "column diagonal" orientation are substantially symmetrical along a perpendicular center line of the second key switch matrix and are substantially symmetrical along a horizontal centerline of the second key switch matrix, as illustrated in FIG. 4 and FIGS. 5A & 5B. In this way, repeat patterns in which a single key switch is mapped to many positions in a matrix may be avoided.

Alternatively to the method 400, key switches in any column of a first key switch matrix may be distributed among all columns of a second key switch matrix, key switches in any row of the first key switch matrix may be distributed among all rows of the second key switch matrix. Further, a column of switches of a first key switch matrix may be staggered across all columns of a second key switch matrix according to a staggering integer or increment. The staggering cycles through all the columns of the second key switch matrix before any repeats occur, and thus that keys in the column of the first key switch matrix are separated by a prime "staggering integer" number of columns. This may be achieved by adding the staggering integer to the column number of the key in the first row to find the column of that key in the second matrix, and by adding the staggering integer to that result to get the column of the key in the second row, and so on and so forth. The staggering integer may be a prime staggering integer that is coprime, i.e., relatively prime, to the number of rows/columns in the key switch matrices.

It is noted that designing multiple orthogonal key switch matrices also be designed similarly. For example, designing multiple orthogonal matrices for N number of key depression combination, such as 5-key depression combination, may involve (1) providing a first key switch matrix; (2) adding on an additional orthogonal key switch matrix that is sufficiently orthogonal to each previously added matrices to reduce ghosting for the N number of key depression combination using guidelines and procedures discussed in reference to FIG. 3; and (3) repeating step 2 until ghosting is eliminated or reduced to an acceptable level for the N number of key depression combination.

FIG. 4 illustrates an example first key switch matrix. FIGS. 5A & 5B each illustrate an example second key switch matrix that is orthogonal to the first key switch matrix of FIG. 4 obtained using the method 300 of FIG. 3. Bolded text in FIG. 5A illustrates an example "row diagonal" orientation of the method 300. Bolded text in FIG. 5B illustrates an example "column diagonal" orientation of the method 300.

The above described apparatus and methods may be used to eliminate or reduce ghosting to an acceptable level, thereby improving keyboard performance and increasing user satisfaction.

It will be appreciated that the keyboard apparatus described herein may be used in conjunction with any suitable computing device configured process the output thereof, including a computer gaming device, a mainframe computer, personal computer, laptop computer, portable data assistant (PDA), computer-enabled wireless telephone, networked computing device, or other suitable computing device.

It should be understood that the embodiments herein are illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

FIGS. 6A, 6B, and 6C illustrate flow of a low signal indicating key depression in a keyboard 600 having plural key switch matrices, including a first key switch matrix 602 and a second key switch matrix 604, coupled to a keyboard controller 606. Key switches A, B, and C are pulled low in a concurrent depression state.

In FIG. 6A, pins of a keyboard controller 606 are shared between the two key switch matrices. Each sense line pin is shared among counterpart sense lines of the first key switch matrix 602 and the second key switch matrix 604. Each drive line pin is shared among counter part sense lines of the first key switch matrix 602 and the second key switch matrix 604. No diodes are used to isolate the two matrices. Upon depression of key switch A, a low signal driven on the column of key switch A of the first key switch matrix 602 may first travel along the column of key switch A, through key switch A, along the row of key switch A, through a common pin 608, to key switch B. The common pin 608 is shared between the sense lines of key switch A and key switch B. The low signal may further travel from the key switch B to a key switch C via a common drive line shared between the key switch B and the key switch C. A low signal indicating key depression is therefore sensed for key switch D, which is not depressed, because key switch D and C share a common sense line pin. Thus, a ghost key depression is caused at key switch D.

In FIG. 6B, pins of a keyboard controller 606 are shared between the two key switch matrices. Each sense line pin is shared among counterpart sense lines of the first key switch matrix 602 and the second key switch matrix 604. Each drive line pin is shared among counter part sense lines of the first key switch matrix 602 and the second key switch matrix 604. In addition diodes are used to isolate the sense lines of the two key switch matrices.

With diodes isolating the sense lines of the key switch matrices, the low signal at key switch A of the first key switch matrix 602 is blocked from entering the second key switch matrix by a diode 610. Consequently, no ghost key depression is caused at key switch D. In general, with diodes isolating the key switch matrices, no low signal in a sense line of one matrix may therefore cause a sense line of a second matrix to go low, thus no key switches in a matrix that is not being scanned may affect scanning of key switches in another matrix.

In FIG. 6C, the first key switch matrix 602 and the second key switch matrix do not share pins. That is, each sense line or drive line of a key switch matrix would have a dedicated pin not shared with another sense line or drive line. A low signal at key switch A does not travel to key switches B and C. Consequently, no ghost key depression at key switch D is detected.

The systems described above may be utilized to detect ghosting efficiently using an economical keyboard design, thereby improving keyboard performance and the user experience.

It should be understood that the embodiments herein are illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

The invention claimed is:

1. A keyboard apparatus, comprising:
   a keyboard including a plurality of keys configured to be depressed in a concurrent depression state;
   a plurality of electronic key switch matrices, each key switch matrix comprising a plurality of key switches and each key switch of the plurality of key switch matrices being configured to be actuated by a corresponding key of the keyboard, one or more keys on the keyboard configured to actuate a key switch in each of the plurality of key switch matrices; and
   a keyboard controller electronically coupled to the plurality of key switch matrices, the keyboard controller configured to determine whether a sensed key depression in the concurrent depression state is a ghost key depression, based on concurrently sensed key switch states of respective key switches in each of the plurality of key switch matrices which correspond to the sensed key depression.

2. The keyboard apparatus of claim 1,
   wherein the keyboard controller includes a key switch state sensing unit configured to utilize a first key switch matrix of the plurality of key switch matrices to sense the concurrent depression state for the plurality of keys of the keyboard.

3. The keyboard apparatus of claim 1, wherein the keyboard controller includes an anti-ghosting logic unit configured to determine whether a potential ghost key combination exists for the concurrent depression state for the plurality of keys of the keyboard.

4. The keyboard apparatus of claim 1, wherein the keyboard controller further includes a ghost key detector configured to utilize a second key switch matrix to determine whether any of the keys that is sensed by the first key switch matrix to be in the concurrent depression state is a ghost key depression or an actual key depression.

5. The keyboard apparatus of claim 1, wherein the plurality of key switch matrices are sufficiently orthogonal to enable the keyboard controller to eliminate ghosting for all 3-key depression combinations of the keyboard.

6. The keyboard apparatus of claim 1, wherein the plurality of key switch matrices are sufficiently orthogonal to enable the keyboard controller to eliminate ghosting for all 4-key depression combinations of the keyboard.

7. The keyboard apparatus of claim 1, wherein the plurality of key switch matrices are sufficiently orthogonal to enable the keyboard controller to eliminate ghosting for all 5-key depression combinations of the keyboard.

8. The keyboard apparatus of claim 1, wherein the plurality of key switch matrices includes a first key switch matrix and a second key switch matrix, and the first key switch matrix and the second key switch matrix are sufficiently orthogonal to enable the keyboard controller to eliminate ghosting for all 3-key depression combinations of the keyboard.

9. The keyboard apparatus of claim 1, wherein the plurality of key switch matrices includes a first key switch matrix and a second key switch matrix, and the first key switch matrix and the second key switch matrix are sufficiently orthogonal to enable the keyboard controller to eliminate ghosting for all 4-key depression combinations of the keyboard.

10. The keyboard apparatus of claim 1, wherein the keyboard controller further includes a key depression processor configured to suppress a reporting of the sensed key depression if the key depression processor determines the sensed key depression is a ghost key depression.

11. The keyboard apparatus of claim 1, wherein each of the plurality of key switch matrices includes a circuit grid, the circuit grid includes a plurality of drive lines intersecting a plurality of sense lines, the circuit grid further includes a plurality of key switches disposed at intersections of the plurality of drive lines and the plurality of sense lines, each of the plurality of key switches configured to be actuated by a corresponding key of the keyboard when the corresponding key of the keyboard is depressed, and a key switch state of each of the key switch matrices is sensed by sequentially selecting and inputting a signal to an arbitrary one of the plurality of the drive lines, and by reading the plurality of sense lines.

12. The keyboard apparatus of claim 11, wherein the keyboard controller includes a plurality of drive line pins and a plurality of sense line pins, each of the plurality of drive line pins is coupled to a corresponding drive line in each of the plurality of key switch matrices, and each of the plurality of sense line pins is coupled to a corresponding sense line in each of the plurality of key switch matrices.

13. The keyboard apparatus of claim 1, wherein each two key switch matrices of the plurality of key switch matrices are electronically isolated by one or more diodes.

14. A method of processing key depressions of a keyboard, comprising:
   sensing a concurrent depression state for a plurality of keys using a first key switch matrix, each of the plurality of keys being associated with a respective key switch of the first key switch matrix, the first key switch matrix being electronic and including a plurality of key switches; and
   detecting that a key of the plurality of keys in the concurrent depression state is in a ghost key depression state by concurrently querying a key switch state of a key switch in a second key switch matrix associated with the detected key, the second key switch matrix being electronic.

15. The method of claim 14, further comprising:
   determining whether a ghost key depression combination exists for the sensed concurrent depression state prior to detecting that a key of the plurality of keys in the concurrent depression state is in a ghost key depression state by querying a key switch state of the key in a second key switch matrix.

16. The method of claim 14, further comprising:
determining that the sensed depression is not a ghost key depression if either a ghost key depression combination is determined to not exist for the sensed concurrent key depression state sensed utilizing the first key switch matrix, or if the ghost key depression combination is determined to exist but a sensed key depression is validated to be an actual key depression utilizing the second key switch matrix.

17. The method of claim 14, further comprising reporting an output indicating a sensed key depression is an actual key depression if the sensed key depression is determined to be an actual key depression, and suppressing reporting of the output indicating the sensed key depression is an actual key depression if the sensed key depression is determined to be a ghost key depression.

18. The method of claim 14, wherein the first key switch matrix and the second key switch matrix are sufficiently orthogonal to eliminate ghosting for all 3-key depression combinations of the keyboard.

19. The method of claim 14, wherein the first key switch matrix and the second key switch matrix are sufficiently orthogonal to eliminate ghosting for all 4-key depression combinations of the keyboard.

20. The method of claim 14, wherein the first key switch matrix and the second key switch matrix are sufficiently orthogonal to eliminate ghosting for all 5-key depression combinations of the keyboard.

* * * * *